(12) United States Patent
Heston et al.

(10) Patent No.: US 7,385,456 B2
(45) Date of Patent: Jun. 10, 2008

(54) POWER ABSORBER SYSTEM AND METHOD

(75) Inventors: David D. Heston, Dallas, TX (US); John G. Heston, Murphy, TX (US); Thomas L. Middlebrook, III, Rowlett, TX (US)

(73) Assignee: Raytheon Company, Waltham, MA (US)

( * ) Notice: Subject to any disclaimer, the term of this patent is extended or adjusted under 35 U.S.C. 154(b) by 224 days.

(21) Appl. No.: 11/129,262

(22) Filed: May 12, 2005

(65) Prior Publication Data

US 2006/0255879 A1  Nov. 16, 2006

(51) Int. Cl.
*H01P 1/22* (2006.01)
(52) U.S. Cl. .................... 333/17.2; 333/81 A
(58) Field of Classification Search ........... 333/17.2, 333/81 A, 81 R; 327/309, 325, 308
See application file for complete search history.

(56) References Cited

U.S. PATENT DOCUMENTS

| | | | | |
|---|---|---|---|---|
| 3,491,314 A | | 1/1970 | White | 333/31 |
| 3,559,109 A | | 1/1971 | Magsughige et al. | 333/7 |
| 3,768,050 A | | 10/1973 | Stiles, Jr. | 333/97 S |
| 4,232,278 A | | 11/1980 | Gawronski et al. | 333/13 |
| 4,267,538 A | * | 5/1981 | Assal et al. | 333/262 |
| 4,810,980 A | | 3/1989 | Heston et al. | 333/17 |
| 5,351,001 A | * | 9/1994 | Kornrumpf et al. | 324/158.1 |
| 5,445,985 A | | 8/1995 | Calviello et al. | 437/51 |
| 6,087,906 A | | 7/2000 | Lampel | 333/17.2 |
| 2002/0180552 A1 | * | 12/2002 | Bennett et al. | 333/17.2 |
| 2005/0024159 A1 | | 2/2005 | Kojima | 333/17.2 |

FOREIGN PATENT DOCUMENTS

GB  1216871  2/1968

OTHER PUBLICATIONS

"Notification of Transmittal of the International Search Report and the Written Opinion of the International Searching Authority, or the Declaration," Int'l Application No.: PCT/US2006/009040; date of mailing: Jul. 18, 2006; Int'l filing date: Mar. 13, 2006; 12 pgs.
David G. Smith et al., "Designing Reliable High-Power Limiter Circuits with GaAs Pin Diodes," 2002 IEEE MTT-S Digest, pp. 1245-1247.

* cited by examiner

*Primary Examiner*—Stephen E Jones
(74) *Attorney, Agent, or Firm*—Baker Botts L.L.P.

(57) ABSTRACT

According to one embodiment of the invention, a power absorber for receiving a signal having a fundamental frequency includes an input node for receiving the signal and a first PIN diode circuit having a first end electrically connected at the input node and a second end. The first PIN diode circuit includes at least one PIN diode. The absorber also includes a load resistance having a first end electrically connected to the second end of the PIN diode circuit and a second end electrically connected to a reference voltage. The absorber also includes a quarter wave transmission line having a first end electrically connected to the input node at a second end. The quarter wave transmission line has an electrical link that is one quarter of the wavelength of the fundamental frequency. The power absorber also includes a second PIN diode circuit having an input electrically connected to the second end of the quarter wave transmission line and an output electrically connected to the reference voltage. The first choke is provided in parallel with the load resistor.

2 Claims, 2 Drawing Sheets

US 7,385,456 B2

POWER ABSORBER SYSTEM AND METHOD

TECHNICAL FIELD OF THE INVENTION

The present invention relates generally to power signals and more particularly to a system and method for power absorption.

BACKGROUND OF THE INVENTION

High power limiters are used to prevent damage to devices such as a low noise amplifier. In one example implementation, a radio frequency receiver include a power limiter in combination with a low noise amplifier. The power limiter limits power provided to the low noise amplifier to avoid damage to the low noise amplifier. Such damage may occur where a receiver is configured to detect low amplitude radio frequency signals and it instead receives a high amplitude signal. Example limiters include reflective limiters and absorptive limiters.

Reflective limiters generally involve shunting PIN diodes to ground in parallel with an RF choke. Alternatively, PIN diodes are shunted to ground in parallel with NIP diodes. Thus, for low radio frequency levels the PIN diode is off and no current flows to ground; the limiter has low loss. For high voltage swings, however, the PIN diode turns on and current flows to ground. Either the choke or the NIP diode provides a current path. In such a case, the received signal is reflected toward the signal source. This results in a disadvantage in that, for example, a clandestine radio frequency receiver can be seen when it reflects the radio frequency energy back to its source.

Absorptive limiters generally use a quarter wave shunt with PIN diodes. For low amplitude received signals the PIN diodes are off, resulting in low current flow. Thus the limiter has a low loss. For high levels, however, the PIN diodes turn off and current flows. In such a case, the output diodes look like a low impedance when turned on. The low impedance of the output diode reflects through a quarter wave line and looks like an open circuit in parallel with a 50 ohm load. Thus, the radio frequency energy is absorbed by the 50 ohm load.

The above-described reflective and absorptive limiters are not satisfactory in all regards. In particular, in certain applications the limiters do not act sufficiently to limit received power.

SUMMARY OF THE INVENTION

According to one embodiment of the invention, a power absorber for receiving a signal having a fundamental frequency includes an input node for receiving the signal and a first PIN diode circuit having a first end electrically connected at the input node and a second end. The first PIN diode circuit includes at least one PIN diode. The absorber also includes a load resistance having a first end electrically connected to the second end of the PIN diode circuit and a second end electrically connected to a reference voltage. The absorber also includes a quarter wave transmission line having a first end electrically connected to the input node at a second end. The quarter wave transmission line has an electrical link that is one quarter of the wavelength of the fundamental frequency. The power absorber also includes a second PIN diode circuit having an input electrically connected to the second end of the quarter wave transmission line and an output electrically connected to the reference voltage. The first choke is provided in parallel with the load resistor.

Some embodiments of the invention may provide numerous technical advantages. Other embodiments may realize some, none, or all of these advantages. For example, according to one embodiment, large amounts of energy may be absorbed in very small devices. In addition, in some embodiments, the insertion loss associated with the absorber may be minimized and the bandwidth of the absorber may be increased.

Other advantages may be readily ascertainable by those skilled in the art.

BRIEF DESCRIPTION OF THE FIGURES

A more complete understanding of embodiments of the invention will be apparent from the detailed description taken in conjunction with the accompanying drawings in which.

DETAILED DESCRIPTION OF EXAMPLE EMBODIMENTS OF THE INVENTION

Example embodiments of the present invention and their advantages are best understood by referring to FIGS. 1 through 5 of the drawings, like numerals being used for like and corresponding parts of the various drawings.

Figure 1:
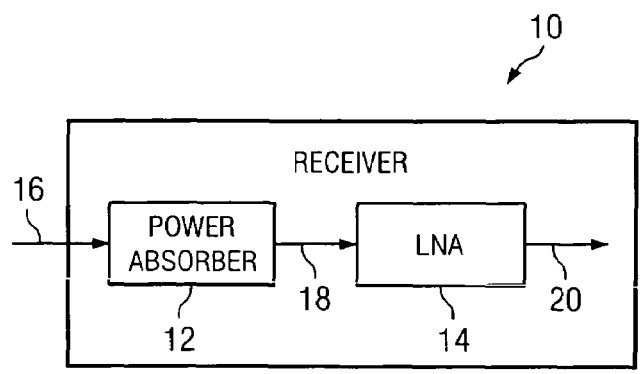
FIG. 1 is block diagram illustrating a receiver according to the teachings of the invention.

FIG. 1 is a block diagram illustrating a receiver 10 according to the teachings of the invention. Receiver 10 may be any receiver for receiving a signal 16, which in one embodiment is a radio frequency signal. In certain implementations, receiver 10 may be configured to receive a low amplitude signal 16, and thus includes a low noise amplifier 14. Because receiver 10 may also receive a high amplitude signal 16, a power absorber 12 is utilized to absorb the high amplitude power of signal 16, and allow a low amplitude signal 18 to pass to the low noise amplifier 14. Low noise amplifier 14 produces an amplified signal 20, which may be utilized by remaining portions of receiver 10 (not explicitly shown).

As described above, some prior power limiters have not worked entirely satisfactory for all purposes. In particular, in some implementations, a high amplitude signal destroys a low noise amplifier 14 because the power limiter is unable to absorb sufficient amounts of power. Alternatively, the power limiter itself is destroyed. According to the teachings of the invention, an improved power absorber and method are provided that address this problem.

Figure 2:
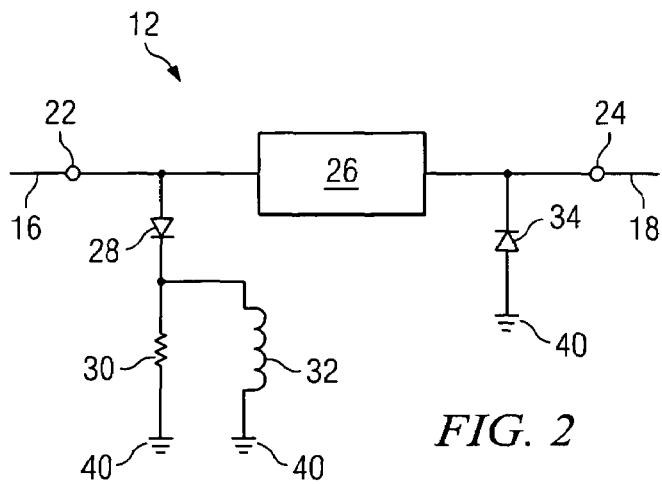
FIG. 2 is a circuit diagram illustrating a power absorber according to one embodiment of the invention.

FIG. 2 is a schematic diagram illustrating one example of a power absorber 12 according to the teachings of the invention. In the illustrated embodiment, power absorber 12 includes an input node 22 and an output node 24. Input node 22 may receive a signal 16, such as a radio frequency or microwave signal, and provide a signal indicative of signal 16 at node 24 as signal 18. In the illustrated embodiment, power absorber 12 includes a PIN diode 28 coupled in series to ground 40 with the parallel combination of a load resistance 30 and a choke 32. In the example in which radio signal 16 is a radio frequency signal, choke 32 is a radio frequency choke. Power absorber 12 also includes a quarter wave line 26 and a PIN diode 34 disposed between quarter wave line 26 and output node 24 and also coupled to ground 40.

PIN diode 28 and PIN diode 34 are well known semiconductor devices that operate as a variable resistor at radio frequencies and at microwave frequencies. Resistance 30 is a 50 ohm load, in one example; however, other suitable loads may be utilized. Choke 32 is, in this embodiment, a quarter wavelength choke; however, choke 32 may also be a spiral choke, which is a high inductance choke, or other suitable choke. In general, the inductance of choke 32 should be large enough such that the 50 ohm impedance is not impaired by the impedance of choke 32. Quarter wave line 26 sized based on the power requirements of power absorber 12 according to conventional techniques. In the illustrated embodiment, quarter wave line 26 has a characteristic impedance of 50 ohms, in one example. Resistance 30 is sized to match the impedance at node 22.

In operation, for signals 16 that are not too large, PIN diodes 28 and 34 are off and no current flows to ground. Thus, absorber 12 acts as a low loss device, allowing the signal 16 to pass from input node 22 to output node 24 without much attenuation. For high voltage swings, such as approximately one volt in the illustrated embodiment, PIN diode 28 turns on, allowing current to flow to ground through resistance 30 and choke 32. PIN diode 34 also turns on, appearing to be a low impedance. However, the low impedance of diode 34 reflects through quarter wave line 26 and looks like an open in parallel with resistance 30 and choke 32. This allows PIN diode 28 and PIN diode 34 to source current for each other and the energy in signal 16 is absorbed primarily by resistance 30.

The teachings of the invention recognize that prior power absorbers that did not utilize choke 32 suffered from a desire to utilize larger PIN diodes and handle the increased current associated with higher power requirements. However, the ability of the PIN diode to handle higher power levels is also a function of the resistance to ground. The lower the resistance to ground, the greater the power level that a particular size diode can handle. Thus, the ability of resistor 30 to handle large currents, choke 32 is provided in parallel with resistance 30 in order to lower the resistance to ground. This lower resistance allows PIN diode 28 to handle more current with lower resistance. Thus, the illustrated topology can handle higher power levels.

Figure 3:
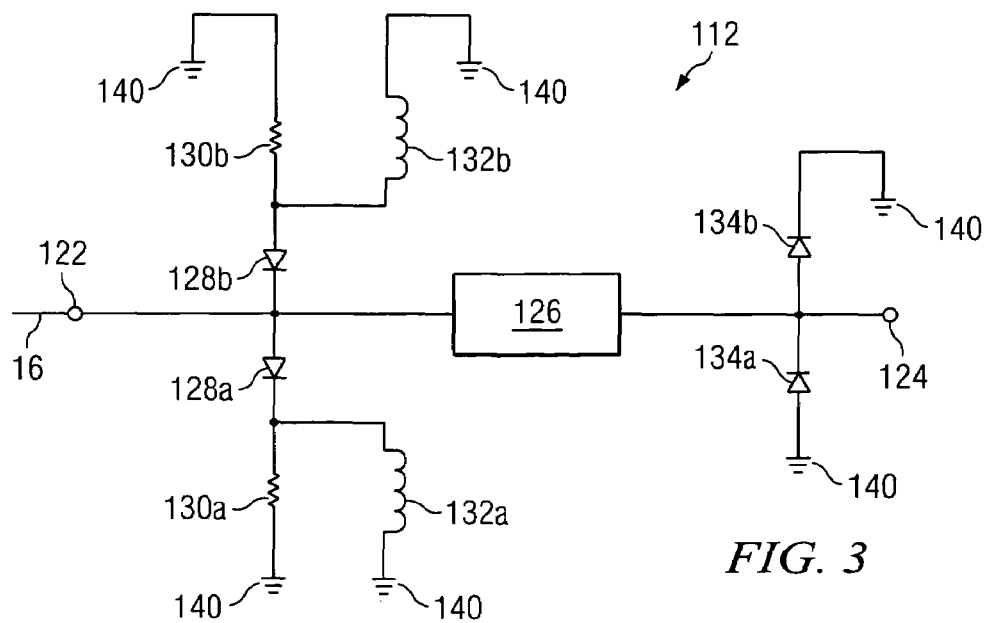
FIG. 3 is a circuit diagram of a power absorber according to another embodiment of the invention.

FIG. 3 illustrates a power absorber 112 according to yet another embodiment of the invention. Power absorber 112 is analogous to the power absorber 12 of FIG. 2 except that the power handling components are reflected about the input 16. Thus, in addition to PIN diodes 128a and 134a, and resistance 130a and choke 132a, PIN diodes 128b and 134b and resistance 130b and choke 132b are provided. The use of the second PIN diode 128b and resistance 130b placed in parallel with PIN diode 128a and resistance 130a increases power handling capability of the PIN diodes and the resistances. In this example, resistances 130a and 130b are changed with respect to the implementation of FIG. 2 from 50 ohms to 100 ohms such that the parallel load combination remains 50 ohms. Other components of FIG. 3 may be similar to the corresponding components of FIG. 2 having analogous reference numerals. The resulting power absorber has greater power handling capability than the absorber of FIG. 2 because half the power is dissipated by each side of the absorber.

Figure 4:
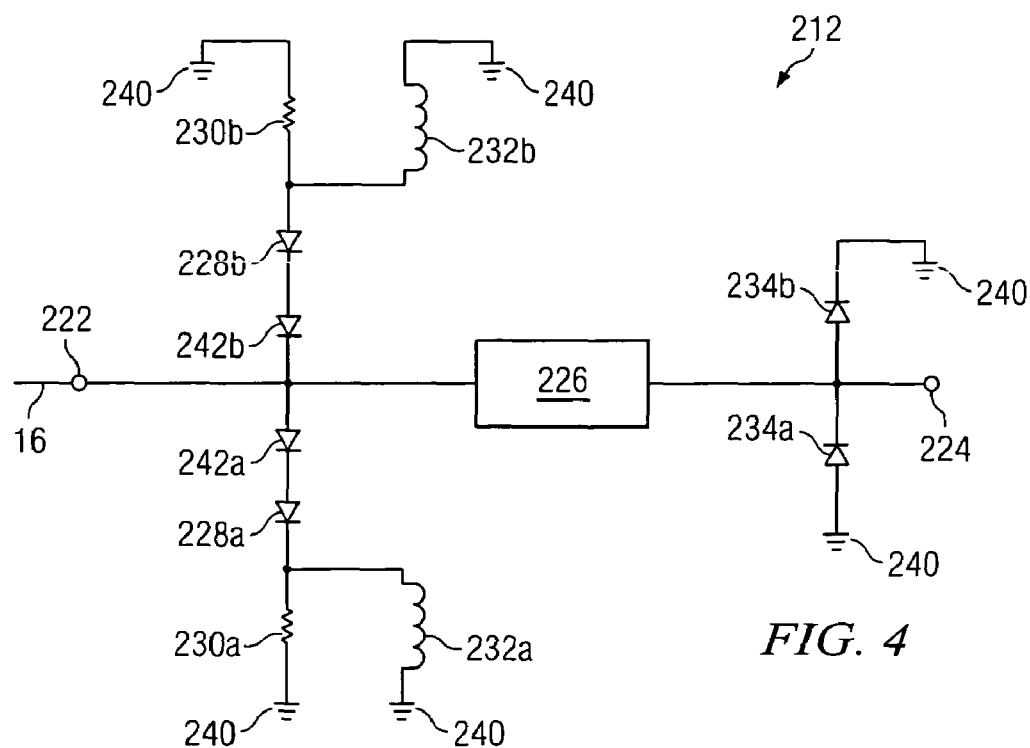
FIG. 4 is a circuit diagram of a power absorber according to yet another embodiment of the invention.

FIG. 4 is a schematic diagram of a power absorber 212 that may be utilized in receiver 10 according to the teachings of the invention. Power absorber 212 is analogous to power absorber 112 of FIG. 3, except that additional PIN diodes 242a and 242b are provided in series with PIN diodes 228a and 228b, respectively. The other components of powers absorber 212 may be similar to corresponding components of power absorbers 12 and 112 having responding reference numerals.

The teachings of the invention recognize that larger PIN diodes have higher "off capacitance" which limits the bandwidth and increases insertion loss. Thus, according to the teachings of this aspect of the invention, PIN diodes 242a and 242b are provided in series with PIN 228a and 228b, respectively, to reduce the off capacitance of the resulting combination and improve the bandwidth and insertion loss of power absorber 212.

Figure 5:
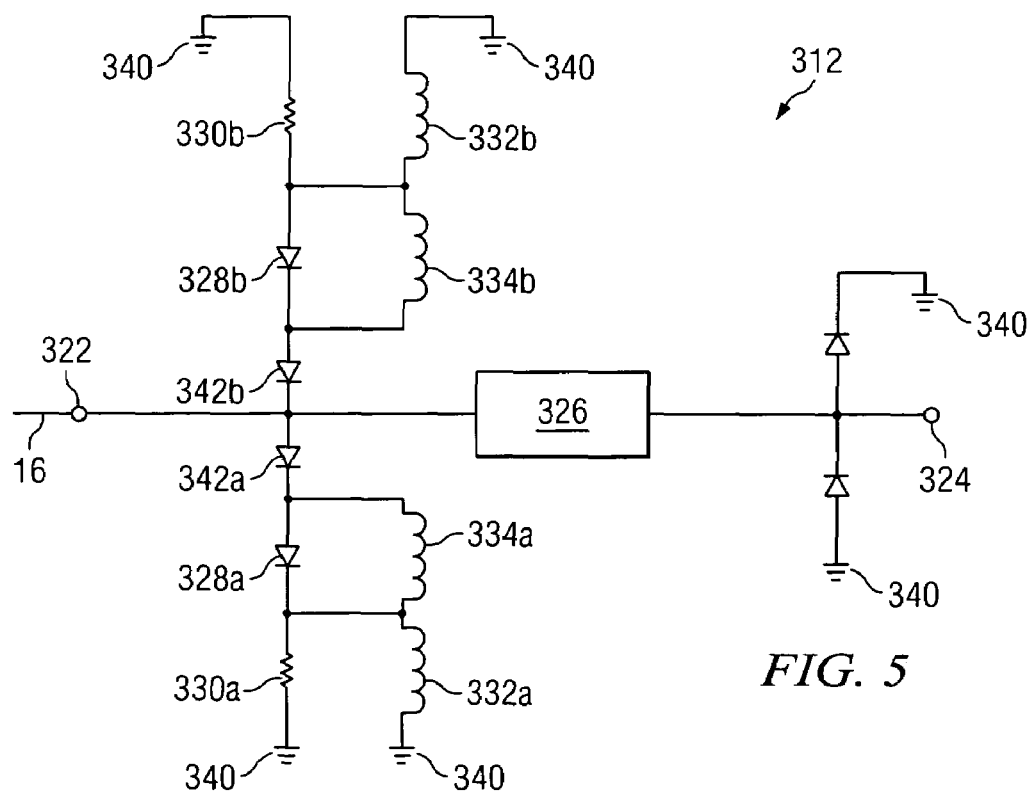
FIG. 5 is a circuit diagram illustrating a power absorber according to yet another embodiment of the invention.

FIG. 5 is a schematic diagram illustrating a power absorber 312 according to yet another embodiment of the invention. Power absorber 312 is analogous to power absorber 212 except that choke 334a and choke 334b is provided in parallel with PIN diode 328a and PIN diode 328b, respectively. Other components of power absorber 312 may be similar to those described above in conjunction with power absorber 212 having analogous reference numerals. The addition of choke 334a and 334b in parallel with one of the PIN diodes results in resonating the "off" capacitance of the diode to a high impedance, which improves a bandwidth and insertion loss of power absorber 312. This resonating occurs at the frequency of operation and can be achieved by properly sizing resonator 334a and 334b to resonate at the frequency of signal 16. The addition of choke 334a and 334b also reduces the resistance to ground for the unresonated PIN diode, improving its power handling capability.

Although the present invention and its advantages have been described in detail, it should be understood that various changes, substitutions, and alterations can be made therein without departing from the spirit and scope of the invention as defined by the appended claims.

What is claimed is:

1. A power absorber for receiving a signal having a fundamental frequency comprising:

an input end for receiving the signal;

a first PIN diode circuit having a first end electrically connected to the input node and a second end, the first PIN diode circuit comprising first and second PIN diodes connected in series and a choke connected in parallel with the second PIN diode;

a load resistance having a first end electrically connected to the second end of the first PIN diode circuit and a second end electrically connected to a reference voltage;

a quarter wave transmission line having a first end electrically connected to the input node and a second end, the quarter wave transmission line having an electrical link that is one-quarter of the wavelength of the fundamental frequency;

a second PIN diode circuit having an input electrically connected to the second end of the quarter wave transmission line and output electrically connected to the reference voltage, the second PIN diode circuit comprising at least one PIN diode; and a first choke in parallel with the load resistor.

2. A method for limiting a signal comprising:

receiving a signal having a fundamental frequency at an input node;

providing a quarter wave transmission line between the input node and an output node, the quarter wave transmission line having an electrical length that is one-quarter of the wavelength of the fundamental frequency;

providing a first path to ground for the received signal, the first path to ground comprising a first PIN diode in series with a first load resistance and a first choke in parallel with the first load resistance;

providing a second path to ground for the received signal, the second path to ground comprising a second PIN diode in series with a second load resistance and a second choke in parallel with the load resistance; and wherein the first path to ground further comprises a resonator in parallel with the first PIN diode;

wherein the first path to ground further comprises a third PIN diode in series with the first PIN diode; and wherein the first path to ground further comprises a resonator in parallel with the first PIN diode.

* * * * *